(12) United States Patent
Weindel et al.

(10) Patent No.: US 12,392,800 B2
(45) Date of Patent: Aug. 19, 2025

(54) TEST HEAD FOR A FINGER TESTER, AND METHOD FOR TESTING PRINTED CIRCUIT BOARDS

(71) Applicant: atg Luther & Maelzer GmbH, Wertheim/Reicholzheim (DE)

(72) Inventors: Christian Weindel, Oelbronn-Duerr (DE); Bernd Ott, Kuenzelsau (DE)

(73) Assignee: ATG LUTHER &MAELZER GMBH, Wertheim/Reicholzheim (DE)

( * ) Notice: Subject to any disclaimer, the term of this patent is extended or adjusted under 35 U.S.C. 154(b) by 32 days.

(21) Appl. No.: 18/564,845

(22) PCT Filed: Jun. 3, 2022

(86) PCT No.: PCT/EP2022/065184
§ 371 (c)(1),
(2) Date: Nov. 28, 2023

(87) PCT Pub. No.: WO2022/254005
PCT Pub. Date: Dec. 8, 2022

(65) Prior Publication Data
US 2024/0385215 A1    Nov. 21, 2024

(30) Foreign Application Priority Data
Jun. 4, 2021   (DE) .................. 10 2021 114 443.4

(51) Int. Cl.
*G01R 1/067*   (2006.01)
*G01R 1/02*    (2006.01)
(Continued)

(52) U.S. Cl.
CPC ..... *G01R 1/06705* (2013.01); *G01R 31/2808* (2013.01)

(58) Field of Classification Search
CPC . G01R 1/02; G01R 1/04; G01R 1/067; G01R 1/073; G01R 31/26; G01R 31/28
See application file for complete search history.

(56) References Cited

U.S. PATENT DOCUMENTS

| | | |
|---|---|---|
| 5,757,159 A | 5/1998 | Boyette et al. |
| 6,087,752 A | 7/2000 | Kim et al. |

(Continued)

FOREIGN PATENT DOCUMENTS

| | | |
|---|---|---|
| CN | 112067977 A | 12/2020 |
| CN | 113341183 A | 9/2021 |

(Continued)

OTHER PUBLICATIONS

International Preliminary Report on Patenability issued on Nov. 21, 2023, from International Application No. PCT/EP2022/065184, filed on Jun. 3, 2022. 14 pages.

(Continued)

*Primary Examiner* — Neel D Shah
(74) *Attorney, Agent, or Firm* — HoustonHogle LLP

(57) ABSTRACT

The invention relates to a test head for a finger tester for testing printed circuit boards, a finger tester and a method for testing printed circuit boards. The test head comprises
- a slide, which can be movably arranged on a traverse of the finger tester,
- a holding module for holding a swivel arm, which is formed at the free end remote from the holding module for receiving a test probe,
- a lifting device, by means of which the holding module is formed to be movable in the vertical direction relative to the slide, the lifting device comprising a vertical guide rail with a rolling bearing, and
- a swivel device for rotating the holding module and thus the pivoting arm about a vertical axis of rotation, wherein the swivel device comprises a motor for rotating the swivel device.

(Continued)

Figure 1:
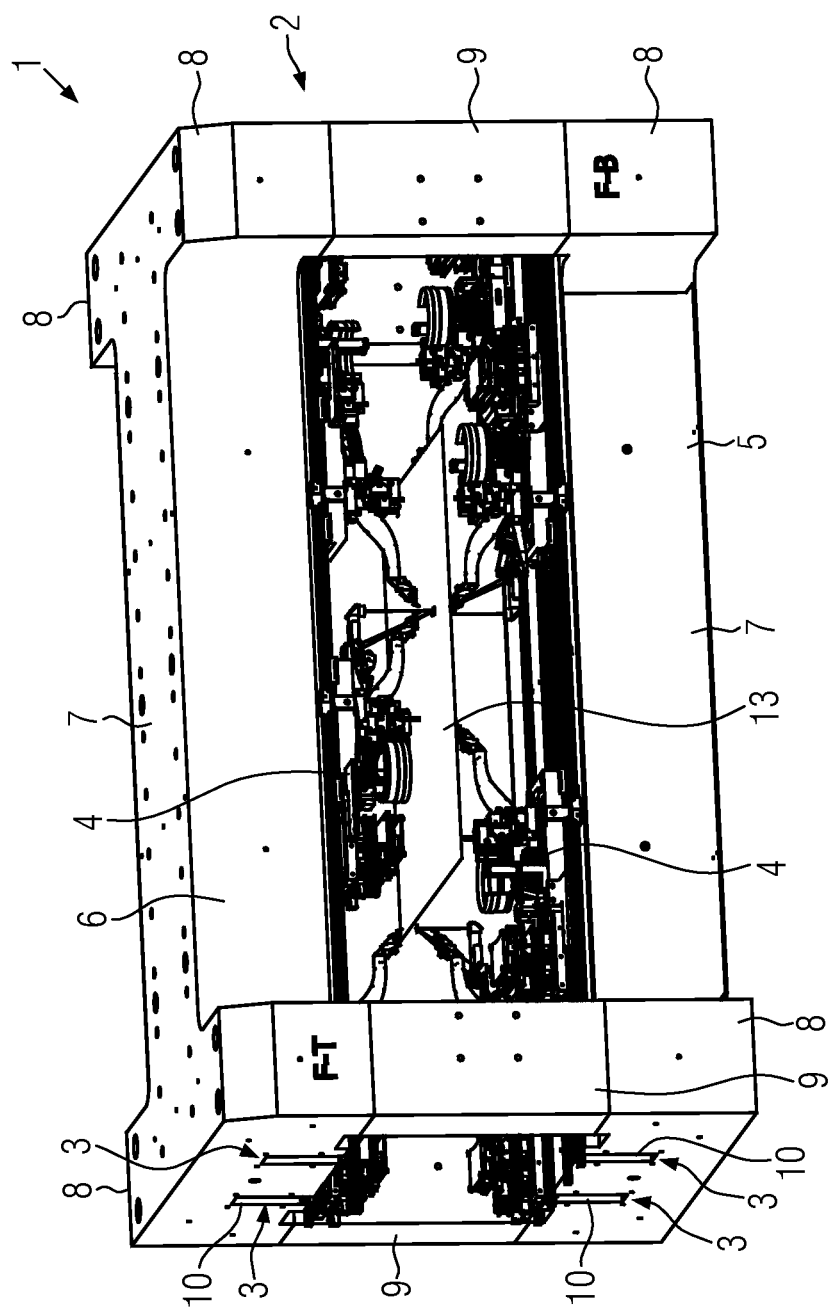

The test head is characterized in that the swivel device comprises a shaft or axis, wherein a rotating member of the swivel device is arranged concentrically to the shaft or axis so that the rotating member surrounds the shaft or axis, and the rotating member is either mounted on the axis with at least one bearing or the shaft is mounted on the slide with at least one bearing, and the motor is formed as a direct drive, wherein the rotating member forms the rotor of the motor.

17 Claims, 4 Drawing Sheets

(51) Int. Cl.
  *G01R 1/073* (2006.01)
  *G01R 31/26* (2020.01)
  *G01R 31/28* (2006.01)

(56) References Cited

U.S. PATENT DOCUMENTS

| | | |
|---|---|---|
| 7,119,558 B2 | 10/2006 | Romanov |
| 7,355,424 B2* | 4/2008 | Romanov .......... G01R 1/06711 |
| | | 324/763.01 |
| 2014/0266276 A1* | 9/2014 | Romanov .......... G01R 31/2808 |
| | | 324/750.25 |

FOREIGN PATENT DOCUMENTS

| | | |
|---|---|---|
| DE | 69712849 T2 | 1/2003 |
| DE | 102013102564 A1 | 9/2014 |
| EP | 0468153 B1 | 10/1995 |
| EP | 0853242 A1 | 7/1998 |
| EP | 1542023 B1 | 1/2007 |
| JP | 2012522234 A | 9/2012 |
| JP | 2020507762 A | 3/2020 |
| KR | 2019990038193 U | 10/1999 |
| WO | WO 2003048787 A1 | 6/2003 |

OTHER PUBLICATIONS

International Search Report of the International Searching Authority, mailed on Oct. 5, 2022, from International Application No. PCT/EP2022/065184, filed on Jun. 3, 2022. 6 pages.
Research Report issued in the DE Patent Application No. 10 2021 114 443.4, mailed on Feb. 11, 2022. 6 pages.

* cited by examiner

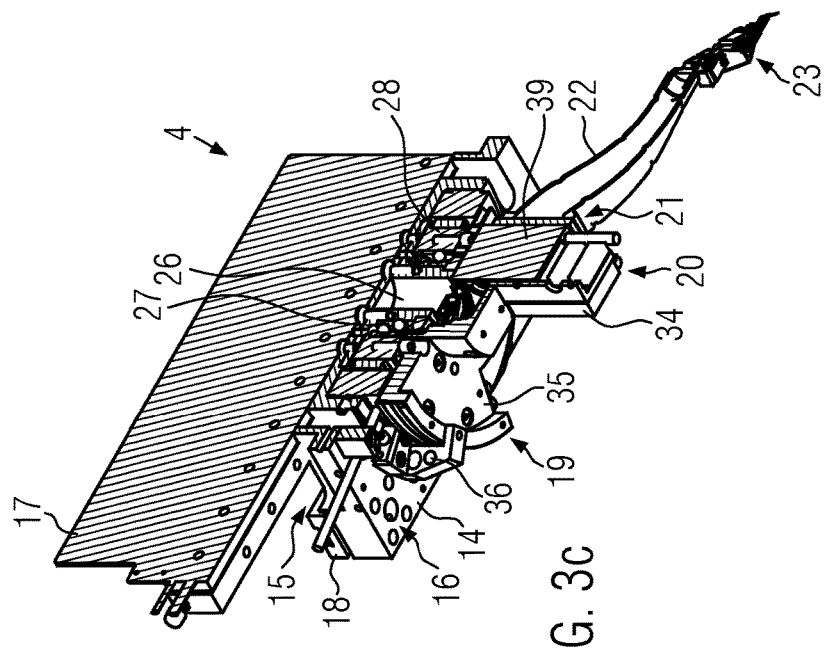
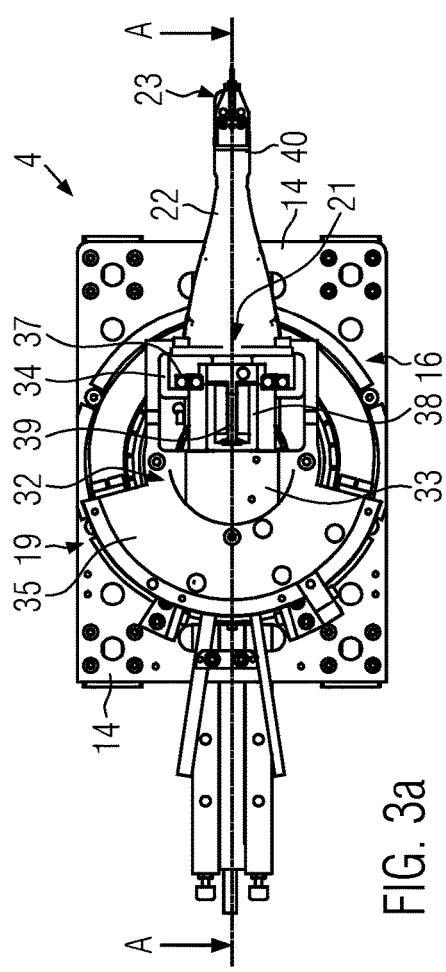
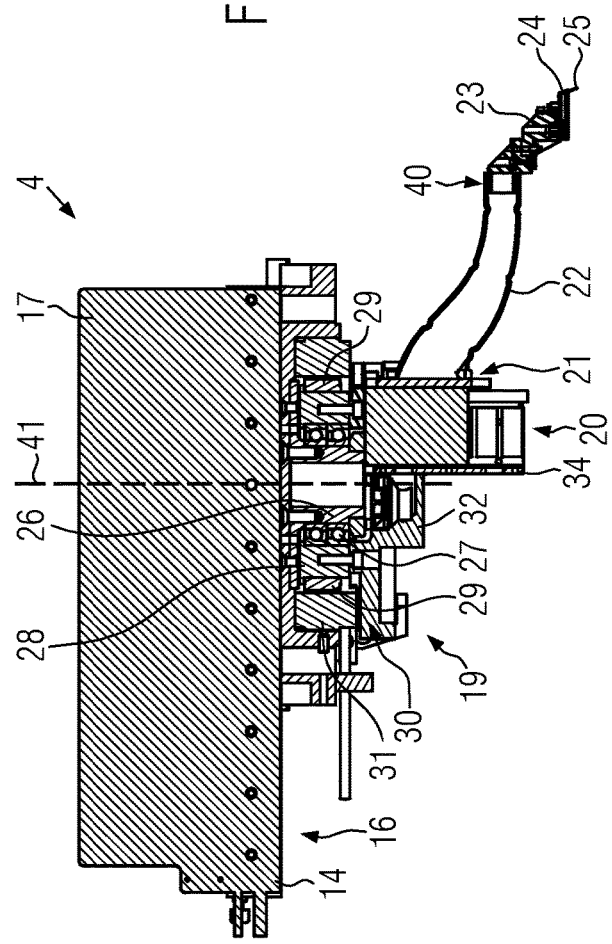

TEST HEAD FOR A FINGER TESTER, AND METHOD FOR TESTING PRINTED CIRCUIT BOARDS

RELATED APPLICATIONS

This application is a § 371 National Phase Application of International Application No. PCT/EP2022/065184, filed on Jun. 3, 2022, now International Publication No. WO/2022/254005, published on Dec. 8, 2022, which International Application claims priority to German Application No. 10 2021 114 443.4, filed on Jun. 4, 2021, both of which are incorporated herein by reference in their entirety.

The present invention relates to a test head for a finger tester, as well as a finger tester with several such test heads and a method for testing printed circuit boards with such a finger tester.

Finger testers are test devices with which contact points of printed circuit boards are successively contacted with one contact finger or test finger each. When testing unassembled PCBs, the traces of a PCB under test are primarily tested for interruptions in the traces and for short circuits between the traces. The measurements are usually made as resistance and/or capacitance measurements. A basic design of such a finger tester can be seen in EP 0 468 153 B1. It discloses a finger tester which has several contact fingers which are mounted on a slide so as to be rotatable about a vertical axis and are adjustable in height, wherein the slides of the individual contact fingers are slidably mounted on horizontal cross-members. The traverses themselves can be moved in a horizontal direction transverse to the longitudinal direction of the respective traverse.

Also, such finger testers are known, in which several traverses are arranged in a fixed position.

EP 0 853 242 A1 describes a method for testing printed circuit boards using a finger tester.

EP 1 542 023 B1 describes a finger tester for testing unassembled printed circuit boards which comprises an air-bearing linear motor on the test head. Such an air-bearing linear motor allows a very fast vertical movement of the test head, whereby the test probe can be quickly contacted with a contact point of a printed circuit board to be tested.

DE 10 2013 102 564 A1 shows a traverse unit for a testing device for printed circuit boards, which is characterized in that the traverse unit is designed to accommodate at least two reciprocally independent linear guides for guiding at least one of the positioning unit, respectively.

The applicant of the present patent application sells such finger testers under the product designations A7 and A8, which comprise a test head with a vertical guide rail with a roller bearing and are thus not mounted on air bearings.

The applicant furthermore produces and sells finger testers under the product designations S2 and S3, which have a linear motor with air bearings on the test head for the vertical movement. The test heads with air bearings are considerably faster than those without air bearings, but they are also considerably more complex to manufacture and correspondingly more expensive. In the case of air-bearing test heads, the parts supported by the air bearing are very lightweight. These are in particular the arms of the contact fingers, which carry the test probes. These arms are very delicate. As a result, they cause only a very low moment of inertia. However, their length is limited and they are sensitive to damage. When replacing test probes, the arm can therefore be easily damaged.

In addition to finger testers, parallel testers are also known for testing printed circuit boards, each of which has an adapter for contacting all contact points of a printed circuit board to be tested simultaneously. Such a parallel tester is, in principle, much faster than a finger tester, but an extra adapter must be manufactured for each type of PCB, which in turn is very expensive.

The success of finger testers on the market is primarily determined by the test speed with which the plurality of contact points on a PCB to be tested can be measured. A printed circuit board usually has several thousand contact points. Many printed circuit boards are only manufactured in small series or are pre-production series that are needed to ramp up mass production, so that the manufacture of an adapter for a parallel tester is often not profitable. However, they are very complicated to test due to their complexity and their large number of contact points.

It is an object of the invention to further develop a finger tester in such a way that, on the one hand, it is simple in design and can be manufactured at low cost and, on the other hand, it enables a high throughput of printed circuit boards to be tested.

According to a first aspect of the present invention, there is provided a test head for a finger tester for testing printed circuit boards, comprising:
  a slide that can be movably arranged on a traverse of the finger tester,
  a holding module for holding a swivel arm which is adapted to receive a test probe at the end remote from the holding module,
  a lifting device with which the holding module is designed to be movable in the vertical direction with respect to the slide, wherein the lifting device comprises a vertical guide rail with a rolling bearing,
  a swivel device for rotating the holding module and thus the pivoting arm about a vertical axis of rotation, wherein the swivel device comprises a motor for rotating the swivel device.

The test head is characterized in that the swivel device comprises a shaft or axis, wherein a rotating member of the swivel device is arranged concentrically to the shaft or axis so that the rotating member surrounds the shaft or axis, and the rotating member is either mounted on the axis with at least one bearing or is mounted via the shaft on the slide with at least one bearing, and the motor is formed as a direct motor, wherein the rotating member forms the rotor of the motor. The axis is fixed to the slide, i.e. it does not rotate, whereas the shaft can rotate relative to the slide.

The motor is adapted to drive the swivel device directly without the interposition of a gear unit. Since the rotating member surrounds the axis or shaft, it has a larger diameter than the axis or shaft. On the one hand, the rotating member represents the rotor of the motor and, on the other hand, is an integral part of the swivel device. In addition, due to the relatively large diameter of the rotating member, a high torque can be exerted, which allows a correspondingly high acceleration during the rotary movement.

Preferably, the motor is a torque motor. Simplified, a torque motor can be regarded as a large servo motor optimized for high torques. Torque motors are usually built as brushless DC motors. However, switched reluctance motors are also sometimes used as torque motors. Preferably, the torque motor is a high-pole servomotor with, for example, at least 20 poles.

The invention is based on the following findings:
  1. When measuring multiple contact points on a PCB under test, most of the time is spent moving a test finger from one contact point on the PCB to another contact point on the PCB, rather than performing the individual measurements.

2. An air-bearing linear guide, as explained above, allows very fast vertical movement of the test head and thus shortens the movement time, but has the disadvantage that due to the air bearing, the moving mass of the test head supported by means of the air bearing is limited and thus only test fingers with relatively short arm lengths of up to a maximum of about 150 mm are possible. A bearing arrangement using a rolling bearing, such as a ball bearing, crossed roller bearing or similar, can also reliably transmit higher masses and torques and allows for longer arm lengths of the test fingers. A greater arm length has several advantages. Firstly, a greater arm length means a greater speed of movement of the test probe attached to the swivel arm at the same rotational speed. Secondly, longer swivel arms also allow for larger test areas. The applicant uses the swivel arms exclusively in an angular range between 0° and a maximum of about 45°, where 0° means that the swivel arm is arranged parallel to the traverse on which the slide of the test probe is mounted, and an angle of 45° means that the swivel arm encloses an angle of 45° with the traverse. In this angle range, a very fast movement of the test probe away from the traverse or towards the traverse is achieved. At larger angles, the speed of movement of the test probe decreases in the transverse direction relative to the traverse. The longer the swivel arm, the larger the width of the area that can be covered with a test head along the corresponding traverse.

3. At the end of a swivel movement, the swivel arms oscillate slightly. The test fixtures described at the beginning comprise steel shafts with a diameter of 8 mm and a distance of approx. 20 mm between an engagement point of the motor (=drive) and the attachment point of the swivel arm (=output) on the shaft. These shafts consist of a solid body. These shafts vibrate somewhat during braking due to the axial offset between the drive and the output. The shaft thus forms a body that is subject to torsional vibration.

In the invention, these torsional vibrations are substantially avoided because a rotating member, which is considerably larger than the shaft, is driven directly, which rotating member is not itself subject to torsion due to its size and rigidity, and is coupled directly to the swivel device or forms an integral part of the swivel device, so that transmission of a torque via a thin shaft is avoided. The axis or the shaft only serve to support the swivel device but not to transmit the driving forces exerted by the motor to the masses of the swivel device to be rotated, in particular the lifting device and the swivel arm. This avoids the torsion of the conventional shaft. This is achieved by separating the bearing, which takes place on the shaft or axis, and the drive on the rotating member.

Preferably, an axis or shaft with a minimum outer diameter of at least 10 mm is formed at the area where the bearing is located on the shaft or axis. The swivel device is supported either on the axis or by means of the shaft. The axis or shaft can also have an outer diameter of at least 20 mm, in particular at least 25 mm or at least 30 mm or even at least 35 mm in the area of the bearing. The larger the diameter of the shaft or axis, the more stable is the bearing of the swivel device.

Preferably, the rotating member is designed with a maximum outer diameter of at least 50 mm. The rotating member can also have a maximum outer diameter of at least 60 mm, in particular at least 70 mm and preferably at least 80 mm. The larger the outer diameter of the rotating member/rotor, the greater the torque generated with it.

If the test probe is to be set with its probe tip with a swiveling movement into a target area with a width of 5 µm, then the torsional vibrations cause a delay, until they have decayed, of 40 ms with a conventional shaft with a diameter of 8 mm and with a distance between the drive and the output on the shaft of 20 mm. With a target window of 25 µm, 5 ms is still required for the oscillation to decay.

It has been shown that the use of an axis or shaft with an outer diameter of at least 15 mm and a test head design according to the invention reduces the time for oscillation to 7 ms for a target window of 5 µm and to 1 ms for a target window of 25 µm. If the axis or shaft has an outer diameter of 55 mm, then the time for swinging out is reduced to less than 0.5 ms for a target window of 5 µm. During this transient oscillation, there is no torsional oscillation of a shaft but a complex oscillation behavior of the swivel arm and tilting oscillations of the shaft or axis, which are smaller the larger its diameter is. With an outer diameter of the axis or shaft of 55 mm, there is thus practically no longer any time requirement for the swing-out of a swivel movement due to the high strength of the bearing.

The swivel device is not being driven by a shaft driven by a motor, but is either rotatably mounted on a stationary or non-rotating axis or is mounted by means of a shaft which preferably has a minimum outside diameter of 10 mm. Such outer diameters require correspondingly large and stable bearings. In addition, the torque motor engages directly with the swivel device independently of the axis or shaft. The forces are introduced at the rotating member, which has a larger diameter than the shaft or axis. This avoids a drive and output offset along the axial direction of a thin shaft, as is common in the prior art. Since in conventional swivel devices the drive and output on the thin shaft are spaced from each other in the axial direction, this causes torsional vibrations of the shaft, which, as the inventors have found out, considerably delay the transient oscillation on small contact points of a printed circuit board to be tested.

In the applicant's finger testers, the printed circuit boards are arranged horizontally in a test area. Therefore, in the present description, "vertical" refers to a direction that is perpendicular to the surface of a printed circuit board to be tested that is located in the finger tester. In principle, it is also possible that in the testing device the printed circuit boards to be tested may not be arranged horizontally but, for example, at an angle or vertically. In this case, the individual elements of the test fixture must be aligned accordingly.

The arm length of the swivel arm is preferably at least 150 mm. The arm length is measured from the vertical axis of rotation to the free end of the swivel arm to which the test probe can be attached. The effective arm length is the arm length from the vertical axis of rotation to a tip of the test probe with which a contact point of a printed circuit board to be tested is to be contacted. The effective arm length is preferably at least 160 mm, in particular at least 170 mm or at least 180 mm.

The bearing is preferably at least an angular ball bearing.

Preferably, the shaft is supported on the slide or the rotating member is supported on the shaft with a set of at least two angular ball bearings, which allows the rotating parts to be positioned and held very precisely with respect to the axis of rotation.

The angular contact bearing(s) preferably comprise(s) ceramic balls.

Preferably, the motor and the rotating member are arranged approximately in the same plane as the at least one rolling bearing. This means that there are no or only very low tilting moments, which can be caused by an axial offset of the drive and the bearing. In addition, an arrangement of motor, rotating element and bearing, in particular rolling bearing, in approximately one plane is very space-saving and compact.

In approximately one plane means that there is a plane which simultaneously extends through the area in which the rolling bearing(s) is/are arranged and which simultaneously extends through the rotating member and the motor. Through this, the motor is concentrically arranged in one plane with the bearing, so that no or only very low tilting moments are exerted on the rotating member or the shaft by the operation of the motor.

If the swivel device has a shaft, then the maximum length of the shaft is preferably 40 mm and in particular only 30 mm. The shorter the shaft, the stiffer it is.

The swivel arm is preferably tubular and made of a fiber composite material. This gives the swivel arm high strength and low weight.

In particular, the swivel arm consists of a monolithic body. The fibers of the fiber composite material are preferably carbon fibers. Such a monolithic body has a high stiffness.

On the one hand, such a swivel arm can be relatively long and lightweight and, on the other hand, its high strength can help to prevent vibrations of the test probe when it approaches a contact point of a printed circuit board to be tested. This applies in particular to the monolithic tubular design of the swivel arm made of a fiber composite material. This swivel arm is therefore very advantageous in combination with the direct drive explained above and the mounting of the lifting device with a rolling bearing. The direct drive avoids the torsional vibrations on a drive shaft known from the prior art and the roller bearing on the lifting device allows for the use of a long swivel arm.

The swivel arm may be tapered towards the free end. This reduces the weight in the direction towards the free end of the swivel arm, which keeps the moment of inertia of the swivel arm low. In addition, the tapering also helps to stiffen the swivel arm.

The swivel arm can be curved in the side view in such a way that the free end of the swivel arm is offset a little from the end attached to the swivel device. The swivel arm can thus be arranged with the free end offset a little away from the slide. The swivel arm is thus bent a little in the direction of a test area in which a specimen is arranged for testing. This curvature of the swivel arm increases the rigidity of the swivel arm and creates space for the arrangement of a camera above the swivel arm, which camera may be attached to the swivel device so that the test probe and in particular a contact tip of the test probe can be detected with the camera in order to determine whether a test point of a printed circuit board to be tested is correctly contacted with the test probe.

The test head can thus be provided with a camera for monitoring the positioning of the probe tip of a test probe.

The rotating member or rotor may comprise several permanent magnets on the outer circumference, which interact with magnetic field coils of a stator of the motor. Since the magnetic field coils are arranged on the stator, no currents need to be transmitted to the rotor to drive the motor. This simplifies the design of the device.

The stator and the rotor of the motor are preferably designed to extend around a complete circle. Since the motor itself is only used to rotate within a range of ±45°, the stator and/or the rotor may also be designed merely in the form of a segment of a circle. However, if the stator and rotor extend around a complete circle, then a much greater torque can be achieved with a compact design of the motor than if the stator or rotor were to extend over only a segment of a circle. Because of this large torque, the swivel device can be swivelled quickly. This is particularly advantageous in combination with a long swivel arm, as this allows the test probe to be moved very quickly between the individual contact points of a circuit board to be tested.

The lifting device is preferably arranged on the swivel device and comprises a linear motor for moving the holding module.

A runner of a linear motor can be formed on the slide to move the slide.

Preferably, the lifting device is arranged offset from the vertical axis of rotation of the swivel device so that a cable, which essentially serves to transmit measurement signals and for motor control, is routed approximately along the vertical axis of rotation in the area between the holding module and the slide. Although this increases the moment of inertia of the test head somewhat, it has the effect of considerably extending the service life of this cable, since in a different design of the test head it would be moved much more when the swivel head is rotated.

According to a further aspect of the invention, there is provided a finger tester for testing printed circuit boards, in particular for testing unassembled printed circuit boards, comprising at least two traverses, on each of which at least one test head is arranged, as explained above.

When testing unassembled PCBs, the traces are tested for interruptions and short circuits between adjacent PCBs. Compared to assembled PCBs, there are many more test points on the PCB to contact and the test heads need to be moved much more often. Therefore, the travel time to move a probe from one test point of a PCB to another test point of a PCB under test is much more significant when testing unassembled PCBs than when testing assembled PCBs. The test heads of this finger tester allow a very fast movement of the test probes with their test needles from one test point to another test point.

Preferably, each traverse is made of a block of stone. The stone block may comprise a groove in which a stator of a linear motor is located so that the runner of the linear motor provided on the test head is moved relative to the stator. Furthermore, guide elements or guide rails can be provided on the stone block, in which the slide is guided along the traverse. The stone block is preferably a granite block.

According to another aspect of the present invention, a method is provided for testing printed circuit boards, in particular for testing unassembled printed circuit boards, using a finger tester as explained above. In this method, after a swinging movement of one of the swivel arms, no more than 5 ms is waited for the swivel arm to swing in until a contact point to be tested is contacted.

Figure 2:
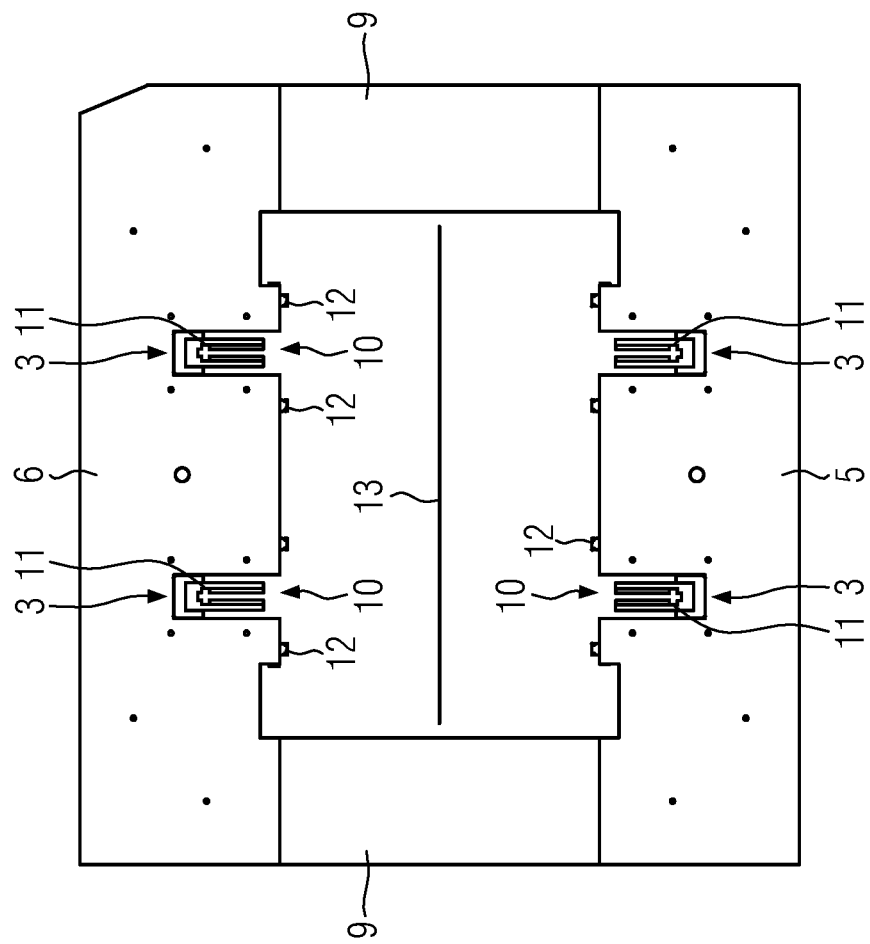
Figure 4:
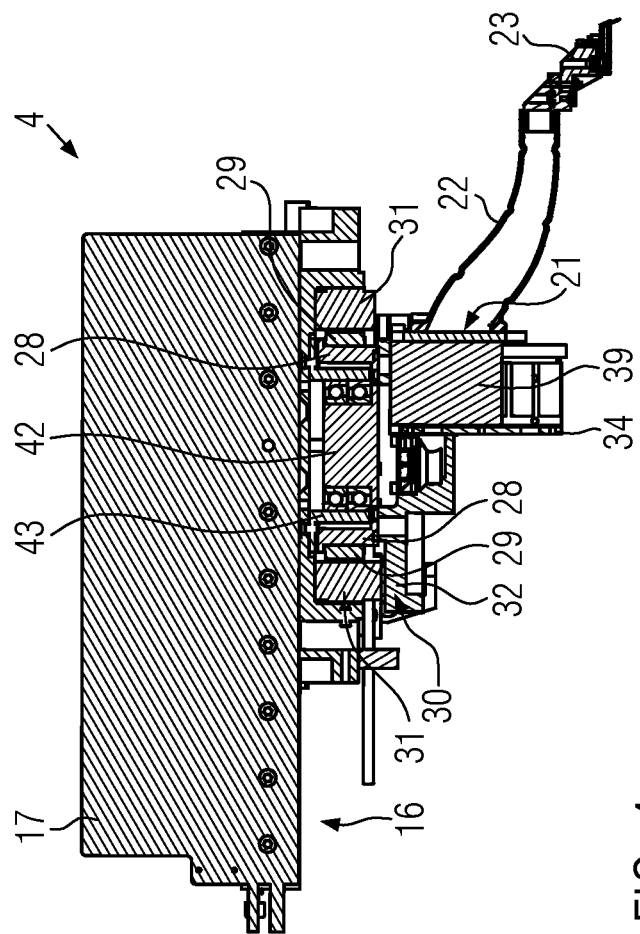

In the following, the invention is explained in more detail by way of example with reference to the drawings, which show in:

FIG. 1 a perspective view of a finger tester with four traverses and eight test heads, FIG. 2 shows a side view of the granite rack of the finger tester without test heads, FIG. 3a a test head in a view from the test area towards the test head, FIG. 3b the test head from FIG. 3a in a lateral sectional view, FIG. 3c the test head from FIG. 3a in a perspective sectional view, FIG. 4 a sectional view through a test head of a further embodiment.

An embodiment of a finger tester 1 according to the invention comprises a rack 2 on which a total of four traverses 3, in each of which two test heads 4 are movably arranged.

The rack 2 is made of granite blocks and comprises a base plate 5, which is double-T-shaped in plan view, and a top plate 6, which is double-T-shaped in plan view. The base plate 5 and the top plate 6 each comprise a longitudinal member 7, at the ends of which a protrusion 8 protrudes on each side. The top plate 6 and the base plates 5 are aligned with each other in plan view, with vertical columns 9 being located between the respective protrusions 8.

Two longitudinally extending grooves 10 are formed on each of the facing surfaces of the longitudinal members 7, each of which forms one of the traverses 3. A stator 11 of a linear motor is arranged in each of the grooves 10, which extends over a large part of the length of the groove 10.

Adjacent to the grooves 10, guide rails 12 are arranged on the surfaces of the longitudinal members 7 facing each other, on which guide rails the test heads 4 can slide with corresponding mating guide elements 18.

A test area 13 is formed centrally and parallel to the longitudinal members 7, in which a printed circuit board to be tested can be accommodated. In FIGS. 2 and 3a, the test area 13 is shown schematically only by a plate located where a printed circuit board to be tested is to be arranged. The test area 13 comprises corresponding holding elements for holding the printed circuit board, which are omitted here to simplify the drawings.

The test heads 4 each comprise a base body 14 which is approximately plate-shaped in plan view and comprises a traverse side 15 facing towards the traverse and test head side 16 facing away from it.

A plate-shaped runner 17 of a linear motor is attached to the traverse side 15, which runner is arranged vertically on the traverse side 15. Adjacent to the runner 17, guide elements 18 are provided for sliding in the guide rails 12.

A swivel device 19 is provided on the test head side 16, on which a lifting device 20 is formed, which can move a holding module 21 in the vertical direction, to which a swivel arm 22 is attached. The swivel arm is formed at the free end remote from the holding module 21 for receiving a test probe 23. The test probe 23 comprises a test needle 24 with a probe tip 25 for contacting contact points of a printed circuit board to be tested.

The swivel device 19 is designed for rotating the unit comprising the lifting device 20, the holding module 21, the swivel arm 22 and the test probe 23 about an axis of rotation 41 which is perpendicular to the test area 13.

The swivel device 19 comprises a vertical axis 26 fixedly attached to the base body 14. In the present embodiment, the vertical axis 26 is formed from a tubular body. Two rolling bearings 27 are arranged on the outer circumference of the vertical axis 26. The vertical axis 26 has a large outer diameter, which in the present exemplary embodiment is 35 mm in the region where the bearings 27 abut the axis. The rolling bearings 27 are angular ball bearings which are pressed together and aligned in opposite directions. This makes it possible to achieve a very tilt-resistant bearing arrangement. A rotating member 28 is located on the outer circumference of the rolling bearings 27. The rotating member 28 is an approximately cylindrical rotationally symmetrical body which is mounted rotatably about the vertical axis 26 by means of the rolling bearings 27.

The rotating member 28 comprises permanent magnets 29 arranged at regular intervals on its outer circumference 29 and forms a rotor of a motor 30. The motor 30 is designed as a torque motor. A stator of the motor 30 is fixedly attached to the base body 14 and surrounds the rotating member 28. The stator 31 comprises a plurality of magnet coils (not shown), which are controlled in such a way that a torque is exerted on the rotating member 28, which forms the rotor of the motor 30.

In the present embodiment, the motor 30 has twenty-eight poles, i.e., a corresponding number of permanent magnets are arranged on the rotating member 28. Preferably, the motor comprises at least twenty poles.

A swivel base body 32 is attached to the rotating member 28, which comprises a central section 33, a lifting rail body 34, and a compensation section 35 diametrically opposite the lifting rail body 34 at the central section 33. The compensation section 35 has the shape of a circular segment in plan view and serves as a counterweight to the lifting rail body 34. As a result, the center of gravity of the swivel device 19 is located in the vicinity of the axis of rotation 41. A line scale is formed on the outer circumference of the compensation section 35, which line scale is scanned by means of an optical sensor 36. This detects the rotational position of the swivel device 19.

The lifting rail body (34) comprises a vertical guide rail.

The holding module 21 is mounted on the lifting rail body 34 by means of rolling bearings 37, so that the holding module 21 is designed to be movable in the vertical direction on the lifting rail body 34. The lifting rail body 34 comprises a stator 38 of a linear motor and the holding module 21 comprises a corresponding slide 39 of the linear motor. The rolling bearings 37 are part of a cross roller guide, which is arranged between the holding module 21 and the lifting rail body 34.

The holding module 21 together with the slide 39 forms a T-shaped body in the plan view, wherein the slide 39 is located in a groove formed by the stator 38 so that the linear motor can be applied with an upward or downward force moment to move the holding module 21 in the vertical direction. As a result, the holding module 21 is moved downward or upward together with the swivel arm 22.

The swivel arm 22 is a one-piece, monolithic body made of a fiber-reinforced composite material. In particular, the swivel arm is made of a fiber composite material with carbon fibers. The swivel arm is tubular in shape with a somewhat circular or elliptical cross-section. The swivel arm has one end attached to the support module 21 and comprises a free end 40 remote from the support module 21. The test probe 23 is arranged at the free end 40 of the swivel arm 22. Such a test probe is known, for example, from WO 03/048787.

The electrical lines with which the motors are controlled, or with which the measurement signals are transmitted from the test probe 23 to an evaluation device (not shown), are not shown in the drawings for ease of illustration. The electrical lines for transmitting the measurement signals may be routed within the hollow swivel arm and through the hollow vertical axis 26. The lifting device 20 is slightly offset from an axis of rotation 41 which passes centrally through the hollow vertical axis 26. The hollow vertical axis 26 represents a body, whereas the axis of rotation 41 is a geometric line. The axis 26, the rolling bearings 27, the rotating member 28 and the stator 31 of the motor 30 are all arranged concentrically with respect to the axis of rotation 41 and are all located in the same plane. This arrangement is both space-saving and free of tilting moments, which would be present if the drive were offset from the bearings 27 with respect to the axis of rotation 41.

This special type of drive or bearing in conjunction with the lifting device 20 mounted by means of rolling bearings 37 allows for the use of a large swivel arm 22, so that a wide scanning range can be scanned along a traverse with a test head 4 and, in addition, the test probe 23 can be moved very quickly away from the traverse or in the direction of the traverse. The test head 4 has a much simpler and less expensive design compared to test heads with air bearings. The special design of the swivel device allows for rapid rotation of the swivel device, with no or only slight oscillation being necessary when a contact point to be contacted is reached. Thus, a high throughput can be achieved in a much simpler way when testing certain printed circuit boards.

A second embodiment of the invention is explained below (FIG. 4). The second exemplary embodiment corresponds essentially to the first exemplary embodiment, whereby the same parts are provided with the same reference sign and are not explained again. Unless otherwise stated below, the explanations of the first exemplary embodiment above apply equally to the present second exemplary embodiment.

The second embodiment differs from the first embodiment in that instead of the stationary vertical axis 26, a rotating shaft 42 is provided, which is rotatably mounted on a bushing 43 by means of the rolling bearings 27. The bushing 43 concentrically surrounds the shaft 42 and the rolling bearings 27 and is fixedly attached to the base body 14 of the test head 4. The shaft 42 extends in the radial direction with a thin, disc-shaped wall over the bushing 43 and is connected to the rotating member 28. The rotating member 28 is thus rotatably mounted on the base body or slide 14 of the test head 4 via the shaft 42.

The shaft 42 can be designed as a solid body or also as a hollow shaft. The outer diameter of the shaft 42 in the area where the shaft 42 rests against the inside of the rolling bearings 27 is again 35 mm.

With both types of test heads 4, a fast swiveling movement can be carried out without a long swiveling-in time. In combination with the stone rack 2, which integrally contains the traverses 3, a finger tester is provided with which printed circuit boards with smallest contact points can be contacted reliably and quickly. The weight of the rack 2 and its rigidity prevent vibrations or other uncontrolled movements due to the movement of the test heads 4, which could impair the positioning accuracy of the test probes.

Preferably, each second test head is provided with a camera 44 (FIG. 1) in order to monitor the position of the test needle 24 or the probe tip 25 with respect to corresponding contact points of a printed circuit board to be tested.

List of reference signs

1 Finger tester
2 Rack
3 Traverse
4 Test head
5 Base plate
6 Top plate
7 Longitudinal member
8 Protrusion
9 Column
10 Groove
11 Stator List of reference signs 12 Guide rail
13 Test area
14 base body
15 Traverse side
16 Test head side
17 Runner
18 Guide element
19 Swivel device
20 Lifting device
21 Holding module
22 Swivel arm
23 Test probe
24 Test needle
25 Probe tip
26 Vertical axis
27 Rolling bearing
28 Rotating member
29 Permanent magnet
30 Torque motor
31 Stator
32 Swivel base body
33 Central section
34 Lifting rail body
35 Compensation section
36 Optical sensor
37 Rolling bearing
38 Stator of linear motor
39 Slide of linear motor
40 Free end
41 Rotation axis
42 Shaft
43 Bushing
44 Camera

The invention claimed is:

1. Test head for a finger tester for testing printed circuit boards, comprising
a slide which can be arranged movably on a traverse of the finger tester,
a holding module for holding a swivel arm which is adapted to receive a test probe at the free end remote from the holding module,
a lifting device by means of which the holding module is adapted to be movable in a vertical direction relative to the slide, the lifting device comprising a vertical guide rail with a rolling bearing, and
a swivel device for rotating the holding module and thus the pivoting arm about a vertical axis of rotation, the swivel device comprising a motor for rotating the swivel device, wherein
the swivel device comprises a shaft or axis, wherein a rotating member of the swivel device is arranged concentrically to the shaft or axis so that the rotating member surrounds the shaft or axis and the rotating member is either mounted on the axis with at least one bearing or is mounted via the shaft on the slide with at least one bearing, and
the motor is formed as a direct drive, wherein the rotating member forms the rotor of the motor.

2. Test head according to claim 1, wherein the length of the swivel arm is at least 150 mm.

3. Test head according to claim 1, wherein the axis or shaft is formed with an outer diameter of at least 10 mm at the area where the bearing is arranged on the shaft or axis.

4. Test head according to claim 1, wherein the rotating member is formed with a maximum outer diameter of at least 50 mm.

5. Test head according to claim 1,
wherein the swivel arm is tubular and made of a fiber composite material.

6. Test head according to claim 5,
wherein the swivel arm is tapered in the direction of the free end and/or is curved in the side view in such a way that the free end of the swivel arm is arranged offset a little relative to the end being fastened to the swivel device.

7. Test head according to claim 1,
wherein the motor and the rotating member are arranged on the same plane as the at least one bearing.

8. Test head according to claim 1,
wherein the swivel device comprises the shaft, which has a maximum length of 40 mm and in particular a maximum length of 30 mm.

9. Test head according to claim 1,
wherein the lifting device is arranged offset from the vertical axis of rotation of the swivel device, so that a cable which serves to transmit measurement signals is guided approximately along the vertical axis of rotation in the region between the holding module and the slide.

10. Test head according to claim 1,
wherein the rotating member comprises a plurality of permanent magnets on the outer circumference, which interact with magnetic field coils of a stator of the motor.

11. Test head according to claim 1,
wherein the motor comprises a stator and a rotor each extending around a complete circle.

12. Test head according to claim 1,
wherein the lifting device is arranged on the swivel device and comprises a linear motor for moving the holding module.

13. Test head according to claim 1,
wherein the slide comprises a runner of a linear motor for moving the slide.

14. Test head according to claim 1,
wherein the test head comprises a camera for detecting a test tip of a test probe.

15. Finger tester for testing printed circuit boards, in particular for testing unassembled printed circuit boards, comprising
at least two traverses, on each of which at least one test head is movably arranged according to claim 1.

16. Finger tester according to claim 15,
wherein
each traverse is formed from a block of stone.

17. A method for testing printed circuit boards, in particular for testing unassembled printed circuit boards, wherein a finger tester according to claim 15 is used,
wherein after a swivel movement of one of the swivel arms, basically no more than 5 ms is waited for the respective swivel arm to swing in until a corresponding contact point of a printed circuit board to be tested is contacted.

* * * * *